United States Patent
Le Prado et al.

(10) Patent No.: US 8,525,516 B2
(45) Date of Patent: *Sep. 3, 2013

(54) APPARATUS WITH AMBIENT MAGNETIC FIELD CORRECTION

(75) Inventors: Matthieu Le Prado, Charmes sur l'herbasse (FR); Jean-Michel Leger, Villard Bonnot (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 529 days.

This patent is subject to a terminal disclaimer.

(21) Appl. No.: 12/747,189

(22) PCT Filed: Dec. 10, 2008

(86) PCT No.: PCT/EP2008/067255
§ 371 (c)(1),
(2), (4) Date: Jun. 10, 2010

(87) PCT Pub. No.: WO2009/074619
PCT Pub. Date: Jun. 18, 2009

(65) Prior Publication Data
US 2010/0259256 A1    Oct. 14, 2010

(30) Foreign Application Priority Data
Dec. 11, 2007  (FR) .................................... 07 59742

(51) Int. Cl.
*G01V 3/00* (2006.01)
*G01R 33/02* (2006.01)

(52) U.S. Cl.
USPC .......... 324/301; 324/307; 324/316; 324/318; 324/244.1; 600/410; 331/3

(58) Field of Classification Search
USPC ...................... 324/300–322; 331/3
See application file for complete search history.

(56) References Cited

U.S. PATENT DOCUMENTS

| 3,284,699 A | 11/1966 | Malnar |
| 6,313,628 B1 | 11/2001 | Leger |
| 6,453,188 B1 * | 9/2002 | Ardenkjaer-Larsen et al. ............... 600/420 |

(Continued)

FOREIGN PATENT DOCUMENTS

| EP | 0 964 260 | 12/1999 |
| FR | 1 354 208 | 1/1964 |

(Continued)

OTHER PUBLICATIONS

Wayne M. Itano, "Atomic Ion Frequency Standards", Proceedings of the IEEE, XP000264852, vol. 79, No. 7, Jul. 1, 1991, pp. 936-941.

(Continued)

*Primary Examiner* — Melissa Koval
*Assistant Examiner* — Emily Chan
(74) *Attorney, Agent, or Firm* — Oblon, Spivak, McClelland, Maier & Neustadt, L.L.P.

(57) ABSTRACT

This atomic clock comprises means for applying two mutually perpendicular oscillating magnetic fields (9, 10), governed by a control device (5) that makes them apply a static or nearly static magnetic field for compensating the ambient magnetic field in order to cancel sub-level energy variations of the matter, which disrupt the frequency of the returned photons and the reference provided by the clock. Traditional magnetic shielding may be omitted. Said device can also operate as a magnetometer.

12 Claims, 2 Drawing Sheets

(56) References Cited

U.S. PATENT DOCUMENTS

| | | | |
|---|---|---|---|
| 6,888,780 B2* | 5/2005 | Happer et al. | 368/10 |
| 7,439,814 B2* | 10/2008 | Happer et al. | 331/3 |
| 8,154,349 B2* | 4/2012 | Le Prado et al. | 331/3 |
| 8,183,942 B2* | 5/2012 | Le Prado et al. | 331/94.1 |
| 2004/0202050 A1 | 10/2004 | Happer et al. | |
| 2005/0121607 A1 | 6/2005 | Miller et al. | |
| 2007/0247241 A1 | 10/2007 | Braun et al. | |
| 2009/0066430 A1 | 3/2009 | Braun et al. | |
| 2010/0188081 A1* | 7/2010 | Lammegger | 324/304 |

FOREIGN PATENT DOCUMENTS

| | | |
|---|---|---|
| JP | 63 191981 | 8/1988 |
| WO | 2005 081794 | 9/2005 |

OTHER PUBLICATIONS

D. W. Swallom, et al., An Investigation of the Energy Exchange Mechanisms Involving the $2^3S$ Metastable Level in an RF Helium Plasma, Journal of Quantitative Spectroscopy and Radiative Transfer, XP024512623, vol. 14, No. 12, pp. 1185-1193.

J. J. Bollinger, et al., "Non-Neutral Ion Plasmas and Crystals, Laser Cooling, and Atomic Clocks", Phys. Plasmas., XP002563571, vol. 1 No. 1, 1994, pp. 1403-1414.

W. Ertmer, et al., "Some Candidate Atoms and Ions for Frequency Standards Research Using Laser Radiative Cooling Techniques", Progress in Quantum Electronics, XP025635622, vol. 8, No. 3-4, Jan. 1, 1984, pp. 249-255.

Preliminary Search Report issued Jan. 15, 2010, in French Patent Application FA 727748.

U.S. Appl. No. 12/796,615.

Haroche S. et al., "Modified Zeeman Hyperfine Spectra Observed in $H^1$ And $Rb^{87}$ Ground States Interacting With a Nonresonant rf Field", Physical Review Letters, vol. 24, No. 16, pp. 861-864 (Apr. 20, 1970).

U.S. Appl. No. 12/743,433, filed May 18, 2010, Le Prado, et al.

\* cited by examiner

APPARATUS WITH AMBIENT MAGNETIC FIELD CORRECTION

This invention relates to an apparatus comprising a correction of the ambient magnetic field; it is added that this apparatus is used in an atomic clock for measuring time, or in a magnetometer, by a simple modification of the operating instructions.

Atomic clocks comprise a gaseous medium, often alkaline, a device for exciting the atoms of this gas such as a laser, capable of making them jump to higher energy states, and a means for measuring a frequential signal emitted by the atoms on returning to the normal energy level, using the photons coming from the laser.

The frequency of the signal of the photons returned by the gas is defined by the formula $\nu=\Delta E/h$, where $\nu$ is the frequency, $\Delta E$ the difference between the energy levels and h Planck's constant, equal to $6.62\times10^{-34}$ J/s.

It is known that this frequency is very stable and that it can thus serve as time reference unit. This is however no longer true when the Zeeman structure of the material is considered: the energy levels then appear as composed of sub-levels corresponding to slightly different states, which are distinguished by their magnetic quantum number m, 0 for a reference state of the energy level and −1, −2, etc. or +1, +2, etc. for the others. This is illustrated by FIG. 1 in the case of the element $^{87}$Rb, in which has been shown the breakdown of the first two energy levels (of angular moments F=1 and F=2).

The energy levels are sensitive to the ambient magnetic field. This sensitivity is low (of the second order) for the sub-level at the magnetic number equal to 0, but much greater (of the first order) for the other sub-levels: the transitions made from or up to them produce photons, the frequency of which is variable and thus cannot serve as reference, and only the portion of the signal corresponding to the transition between the two sub-levels of zero magnetic number is exploited for the measurement, which adversely affects its quality. The reference frequency given by the clock is then the hyperfine transition frequency considered in the gas $fo=E_0/h$, where $E_0$ is the energy difference between the sub-levels at m=0 of the two states (F=1 and F=2 in the example of FIG. 1).

One thus resorts to a magnetic shield around the clock to reduce exterior perturbations and to the application of a constant magnetic field to properly separate the sub-levels, for want of guaranteeing a zero magnetic field. Although the operation of the clock is made more stable, the sub-levels then being immobile and thus well defined, the drawback of undergoing a dispersion of the frequencies and having to make do with a weakened signal is not avoided.

With the invention, it is endeavoured to improve existing atomic clocks by making them work in zero magnetic field in order to concentrate the sub-levels at a same energy value and to obtain a signal comprising a much sharper measurement peak. These considerations apply without change to other apparatuses and in particular to magnetometers, to which the invention thus also applies.

It consists in an apparatus that can serve as atomic clock or magnetometer, comprising a cell filled with a gas, an exciter of the gas to make its atoms jump to a higher energy level, a detector to collect a light signal passing through the gas, characterised in that it comprises means for applying magnetic fields, applying an essentially static magnetic field and two oscillating magnetic fields and directed perpendicular to each other, and means for controlling the means for applying magnetic fields to regulate in direction and in intensity the essentially static magnetic field.

The invention will be described in a more complete manner with reference to the following figures:

FIG. 1, already described, illustrates an energy level diagram of an element of a material used in an atomic clock;

Figure 1:
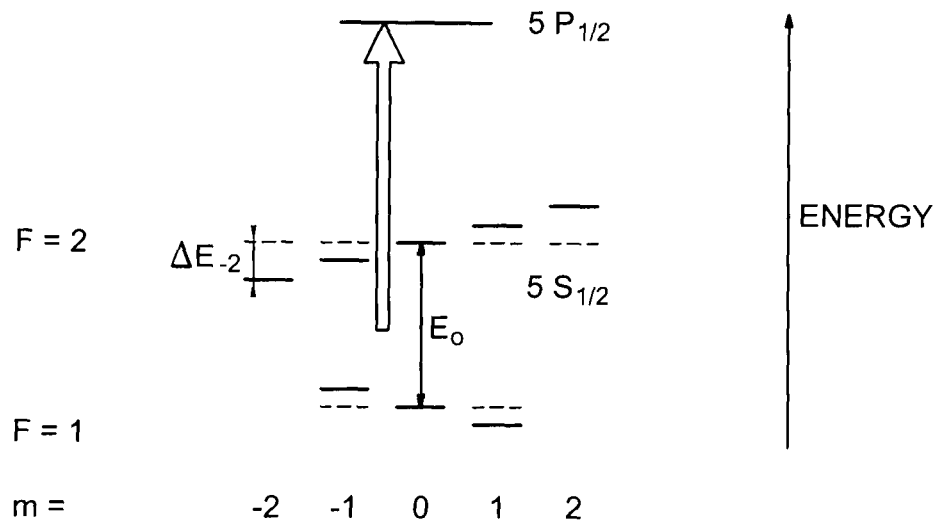
Figure 4:
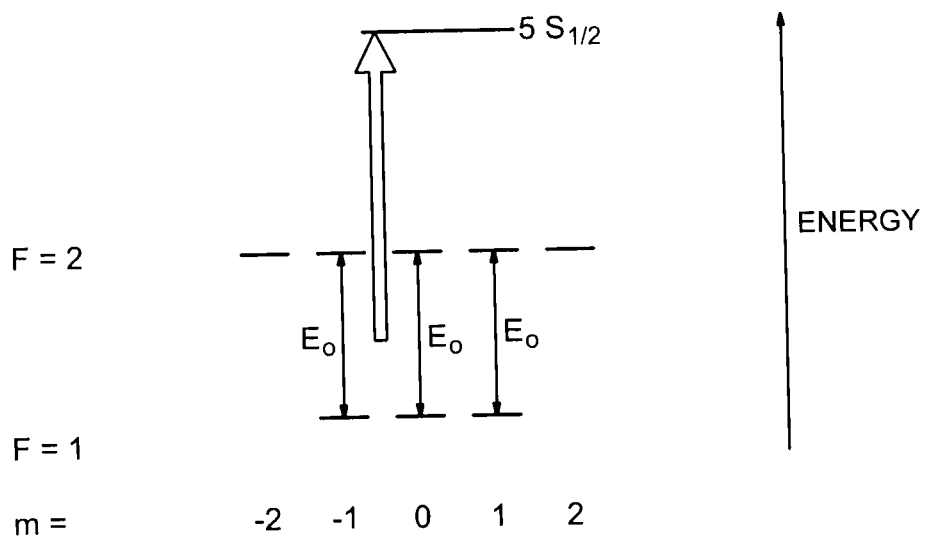

finally, FIG. 4 illustrates the result obtained, according to an energy level diagram to compare with that of FIG. 1.

Figure 2:
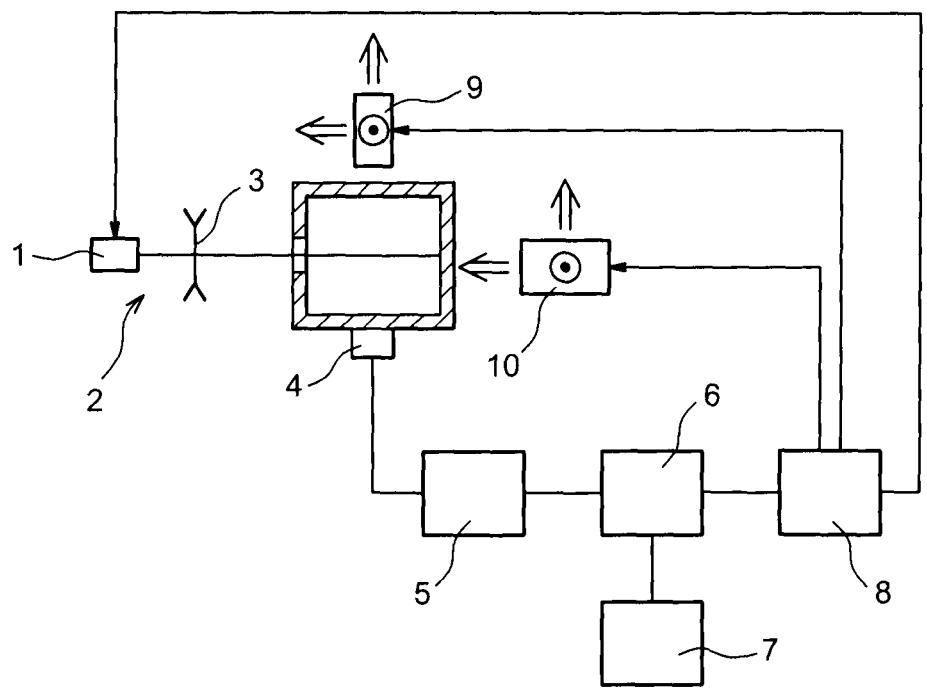
FIG. 2 is a schematic view of the clock.

The core of the clock (FIG. 2) is a cell filled with an alkali gas. An exciter 2 transmits energy to this gas in the form of a flux of polarised photons passing through a circular polariser 3. The exciter may also be a field of microwaves for example. It will then be necessary in any case to inject a light beam (for example a laser) to detect the resonances of the gas. A photodetector 4 collects the luminous energy returned by the gas of the cell 1 and transmits a signal to a counting device 5. A frequency separator 6 collects the signal at the output of the counting device 5 and transmits its results in the form of an indicator of intensity of the spectral lines measured to a device for operating 7 the clock and a control device 8, which governs the exciter 2 as well as means for applying magnetic fields 9 and 10. The latter emit magnetic fields at radiofrequencies of pulsations noted $\Omega$ and $\omega$, which are mutually perpendicular and of direction depending on the polarisation (for example perpendicular to the light rays emitted by the exciter 2 in the case of a circular polarisation).

Figure 3:
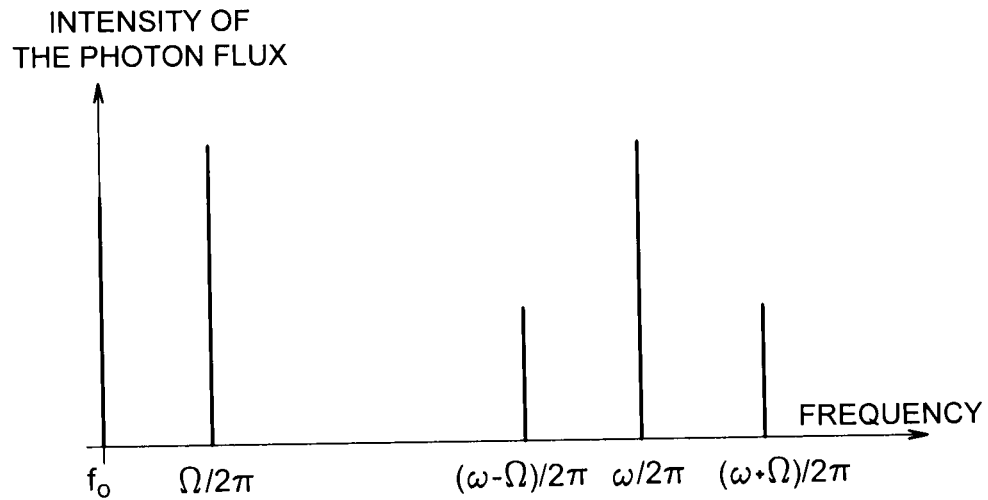
FIG. 3 is a diagram of the signal obtained with the clock.

Reference is made to FIG. 3. The signal coming from the counting device 5 comprises several light rays, and firstly one that is at the useful frequency $f_0$ corresponding to the return of the photons by the gaseous medium and which gives the reference to the time measurement. It again shows spectral lines at the frequencies $\Omega/2\pi$, $(\omega-\Omega)/2\pi$, $\omega/2\pi$, and $(\omega+\Omega)/2\pi$. These spectral lines appear for magnetic fields of low values, very much less than $1/\delta \cdot T_R$, where $T_R$ is the relaxation time of the sub-levels and $\gamma$ is their gyromagnetic ratio, characteristic of the excited chemical element. They correspond to resonances between the sub-levels. Their amplitude is proportional to the ambient magnetic field. It is thus taught by the invention to apply a magnetic field for compensating the essentially static ambient magnetic field, but which is made to vary in a continuous manner in amplitude and in direction if necessary, so that the amplitude of these rays is reduced as much as possible, which signifies that the compensation field has balanced out the ambient magnetic field. FIG. 4 then shows that the sub-levels of each main level are at a same energy value, so that the photons returned by the gaseous medium are all at the useful frequency $f_0$: the corresponding spectral line appears in the form of a much sharper and higher peak, the detection of which is thus facilitated.

By applying the invention, it becomes possible to omit traditional magnetic shielding of atomic clocks.

The amplitudes of the radiofrequency fields are advantageously chosen to maximise the amplitude of resonance spectral lines (before the application of the static compensation field). It is advisable to respect approximately the equalities $\gamma H\omega/\omega=1$ and $\gamma H\Omega/\Omega=1$, where $H\omega$ and $H\Omega$ are the amplitudes of the radiofrequency fields of pulsations $\omega$ and $\Omega$. Advantageously, the means for applying the substantially static compensation magnetic field are identical to those that apply radiofrequency magnetic fields.

The unique exciter may be a flux of photons such as a laser flux emitted for example by a diode laser or a lamp. The gaseous element may consist of $^{87}$Rb, $^{133}$Cs, with mixing if necessary with a buffer gas. The material of the cell 1 may consist of a glass such as Pyrex (registered trademark). The means for applying magnetic fields 9 and 10 may consist of triaxial coils, or of three mutually concentric monoaxial coils.

The photodetector 4 may be of any type measuring a flux of photons at the output of the cell 1. These photons have to be polarised for example by polarisers added to the exciter. The control is accomplished by any known material comprising a computing unit. The coils are current or voltage controlled. The excitation to the resonance frequency $f_0$ is accomplished by an amplitude modulation of the diode laser at the frequency $f_0/2$ or by a microwave cavity resonating at the frequency $f_0$. An exciter comprising two lasers, the difference in frequency of which is $f_0$, may also be envisaged.

Since all the sub-levels become equivalent in zero field (independently of their m value), it is then possible to use other gases than those normally used (alkaline gases) in atomic clocks, in particular gases in which the hyperfine structure of their atoms does not have sub-levels with zero angular momentum, such as $^3$He.

In a concrete example where the clock operated with $^{87}$Rb, and a wavelength of the returned photons of 795 nm, the radiofrequency fields had frequencies $\Omega/2\pi$ and $\omega/2\pi$ of 10 kHz and 45 kHz, and respective amplitudes of 15 mGauss and 70 mGauss. With an ambient magnetic field of the order of 10 mGauss, the compensation was made with residual field less than 10 mGauss at each axis. The resolution on the compensation magnetic field (magnetic noise due to disruptions of the control means) was of the order of $0.1\mu$ Gauss/$\sqrt{Hz}$. The frequency stability of the clock was of the order of 0.67 Hz/$\sqrt{Hz}$, i.e. $10^{-10}/\sqrt{\tau}$ in relative resolution on the frequency delivered by the clock for an integration time $\tau$.

The use of the invention has been described for an atomic clock, which may be of sequential or Ramsay fringe operation. It could also be applied to the measurement of magnetic fields, in other words as magnetometer. It would suffice to record the compensation magnetic field applied when the spectral lines of FIG. 3 due to the radiofrequency fields would be at the minimum, reading it on the means for applying magnetic fields 8 and 10: the ambient magnetic field would be opposed.

It is interesting to note that since the field seen by the atoms is zero, a magnetic shield proves to be superfluous.

The invention claimed is:

1. An apparatus comprising:
   a cell filled with a gas;
   an exciter of the gas to make atoms of the gas jump to a higher energy level;
   a detector to collect a light signal passing through the gas;
   means for applying an essentially static magnetic field and two oscillating magnetic fields directed perpendicular to each other; and
   means for controlling the means for applying the essentially static magnetic field and the two oscillating magnetic fields in order to regulate in direction and in intensity the essentially static magnetic field, and cause a reduction in an amplitude of spectral lines of the light signal passing through the gas among frequencies ($\Omega/2\pi$, $\omega/2\pi$) of the two oscillating magnetic fields, a sum ($\omega+\Omega)/2\pi$) of said frequencies and a difference ($\omega-\Omega)/2\pi$) of said frequencies.

2. The apparatus according to claim 1, wherein said apparatus is an atomic clock.

3. The apparatus according to claim 1, wherein said apparatus is a magnetometer.

4. The apparatus according to claim 1, wherein the means for applying the essentially static magnetic field and the two oscillating magnetic fields comprise at least one triaxial magnetic coil.

5. The apparatus according to claim 1, wherein the means for applying the essentially static magnetic field and the two oscillating magnetic fields comprise at least three concentric monoaxial coils.

6. The apparatus according to claim 1, wherein the gas is an alkaline gas.

7. The apparatus according to claim 1, wherein said apparatus is devoid of magnetic shielding.

8. The apparatus according to claim 1, wherein said two oscillating magnetic fields have intensities (H$\omega$, H$\Omega$) equal to respective pulsations ($\omega,\Omega$) of said two oscillating magnetic fields, divided by a gyromagnetic ratio of the gas.

9. The apparatus according to claim 1, wherein the gas is helium 3.

10. An apparatus comprising:
    a cell filled with a gas;
    an exciter of the gas that makes atoms of the gas jump to a higher energy level;
    a detector that collects a light signal passing through the gas;
    a magnetic unit that applies an essentially static magnetic field and two oscillating magnetic fields directed perpendicular to each other; and
    a controller that controls the magnetic unit in order to regulate in direction and in intensity the essentially static magnetic field, and cause a reduction in an amplitude of spectral lines of the light signal passing through the gas among frequencies ($\Omega/2\pi$, $\omega/2\pi$) of the two oscillating magnetic fields, a sum ($\omega+\Omega)/2\pi$) of said frequencies and a difference ($\omega-\Omega)/2\pi$) of said frequencies.

11. The apparatus according to claim 10, wherein the magnetic unit comprises at least one triaxial magnetic coil.

12. The apparatus according to claim 10, wherein the magnetic unit comprises at least three concentric monoaxial coils.

* * * * *